United States Patent
Chung et al.

(10) Patent No.: US 7,655,519 B2
(45) Date of Patent: Feb. 2, 2010

(54) METHODS OF FABRICATING METAL-INSULATOR-METAL CAPACITORS WITH A CHEMICAL BARRIER LAYER IN A LOWER ELECTRODE

(75) Inventors: Eun-ae Chung, Gyeonggi-do (KR);
Jae-hyoung Choi, Gyeonggi-do (KR);
Jung-hee Chung, Seoul (KR);
Young-sun Kim, Gyeonggi-do (KR);
Cha-young Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 184 days.

(21) Appl. No.: 11/216,639

(22) Filed: Sep. 1, 2005

(65) Prior Publication Data
US 2006/0113578 A1   Jun. 1, 2006

(30) Foreign Application Priority Data
Nov. 30, 2004   (KR)   .................. 10-2004-0099058

(51) Int. Cl.
*H01L 21/8242* (2006.01)
(52) U.S. Cl. .................. 438/253; 257/E21.648; 438/396
(58) Field of Classification Search ............... 438/391, 438/253, 396; 257/E21.648
See application file for complete search history.

(56) References Cited

U.S. PATENT DOCUMENTS

| | | | | |
|---|---|---|---|---|
| 5,005,102 | A * | 4/1991 | Larson | 361/313 |
| 6,078,492 | A * | 6/2000 | Huang et al. | 361/301.4 |
| 6,486,518 | B1 * | 11/2002 | Okumoto et al. | 257/379 |
| 6,645,811 | B2 * | 11/2003 | Roh | 438/253 |
| 6,670,256 | B2 * | 12/2003 | Yang et al. | 438/396 |
| 2001/0001501 | A1 * | 5/2001 | Lee et al. | 257/534 |
| 2001/0023110 | A1 * | 9/2001 | Fukuzumi et al. | 438/396 |
| 2003/0232483 | A1 * | 12/2003 | Fujiishi | 438/396 |
| 2004/0051131 | A1 * | 3/2004 | Miyajima | 257/306 |

(Continued)

FOREIGN PATENT DOCUMENTS

JP   2001-053251   2/2001

(Continued)

OTHER PUBLICATIONS

Korean Intellectual Property Office "Notice to Submit Response" for Korean Appl. No. 10-2004-0099058, issued on Mar. 29, 2006.

(Continued)

*Primary Examiner*—Asok K Sarkar
(74) *Attorney, Agent, or Firm*—Myers Bigel Sibley & Sajovec, P.A.

(57) ABSTRACT

A metal-insulator-metal (MIM) capacitor includes a lower electrode, a dielectric layer, and an upper electrode. The lower electrode includes a first conductive layer, a chemical barrier layer on the first conductive layer, and a second conductive layer on the chemical barrier layer. The chemical barrier layer is between the first and second conductive layers and is a different material than the first and second conductive layers. The dielectric layer is on the lower electrode. The upper electrode is on the dielectric layer opposite to the lower electrode. The first and second conductive layers can have the same thickness. The chemical barrier layer can be thinner than each of the first and second conductive layers. Related methods are discussed.

19 Claims, 7 Drawing Sheets

U.S. PATENT DOCUMENTS

2005/0003609 A1* 1/2005 Fazan et al. .................. 438/253
2005/0023640 A1* 2/2005 Choi et al. .................. 257/532

FOREIGN PATENT DOCUMENTS

| KR | 1020000065969 | 11/2000 |
| KR | 1020040000602 | 1/2004 |
| KR | 10-2006-0011443 | 2/2006 |

OTHER PUBLICATIONS

English translation of Korean Intellectual Property Office "Notice to Submit Response" for Korean Appl. No. 10-2004-0099058, issued on Mar. 29, 2006.

* cited by examiner

METHODS OF FABRICATING METAL-INSULATOR-METAL CAPACITORS WITH A CHEMICAL BARRIER LAYER IN A LOWER ELECTRODE

CROSS-REFERENCE TO RELATED PATENT APPLICATION

This U.S. non-provisional patent application claims priority under 35 U.S.C. § 119 to Korean Patent Application No. 10-2004-0099058, filed on Nov. 30, 2004, in the Korean Intellectual Property Office, the disclosure of which is incorporated herein in its entirety by reference.

FIELD OF THE INVENTION

The present invention relates to a semiconductor devices and, more particularly, to metal-insulator-metal (MIM) capacitors and methods of fabricating MIM capacitors.

BACKGROUND OF THE INVENTION

The continuing trend toward increasing the number of semiconductor devices in chips has driven a continued reduction in the feature sizes of the devices. Although device feature sizes are decreasing, in some memory devices, such as dynamic random access memories (DRAMs), capacitors therein should continue to provide at least a threshold capacitance so as to reliably store data.

One method of increasing the capacitance of capacitors in semiconductor memories includes reducing an equivalent thickness of oxide (EOT; Toxeq) of a dielectric layer therein. For example, capacitors that are fabricated according to a 70 nm design rule may need a dielectric layer thickness of about 14 EOT to provide sufficient capacitance when the capacitors have a cylindrical structure height of 1.8 µm. The lower electrode of the capacitors is often formed from polysilicon. Because the polysilicon can become undesirably oxidized during fabrication of the capacitors, it can be difficult to reduce their dielectric layer EOT to 14 or lower.

Fabrication of capacitors with metal lower electrodes have been proposed to avoid such oxidation of the lower electrode during fabrication. Capacitors with metal lower electrodes have been formed from titanium nitride (TiN), which provides low reactivity, stable leakage current, and high conductivity.

A conventional method of forming a lower electrode using TiN is explained below with reference to FIGS. 1A through 1C.

Referring to FIG. 1A, an interlayer insulating layer 20 with a conductive plug 25 extending there through is formed on a semiconductor substrate 10. An etch stopper 30 of silicon nitride is deposited on the interlayer insulating layer 20. A mold oxide layer 35 is formed on the etch stopper 30. The mold oxide layer 35 and the etch stopper 30 are etched to expose a predetermined portion of the conductive plug 25, thereby defining a lower electrode region 35a. A titanium nitride (TiN) layer 40 for a lower electrode is deposited on the lower electrode region 35a and the mold oxide layer 35. A sacrificial oxide layer 45a is deposited on the titanium nitride layer 40.

Referring to FIG. 1B, a chemical mechanical polishing (CMP) process is performed on the sacrificial oxide layer 45a and the titanium nitride layer 40 until a surface of the mold oxide layer 35 is exposed. Then, the remaining sacrificial oxide layer 45a and the mold oxide layer 35 are wet-etched using an LAL solution (mixture solution of deionized water, $NH_4F$ and HF) or HF solution to form a lower electrode 40a.

Referring to FIG. 1C, after a dielectric layer 45b is formed on a surface of the lower electrode 40a and on the etch stopper 30, an upper electrode 50 is formed on the dielectric layer 45b to form a capacitor 55.

When removing the remaining sacrificial oxide layer 45a and the mold oxide layer 35 to form the lower electrode 40a, the wet etch chemical may penetrate into the lower electrode 40a or the interface between the lower electrode 40a and the etch stopper 30. When the etch chemical so penetrates, the interlayer insulating layer 20, which is located below the lower electrode 40a and the etch stopper 30, may be partially removed. Moreover, when the conductive plug 25 is formed from polysilicon, the conductive plug 25 may be also partially removed by the penetrating etch chemical. When the interlayer insulating layer 20 and/or the conductive plug 25 are partially removed by the etch chemical, the electrical characteristics of the capacitor 55 may be deteriorated and cause a bit failure in the associated memory device.

SUMMARY OF THE INVENTION

Some embodiments of the present invention provide a metal-insulator-metal (MIM) capacitor that includes a lower electrode, a dielectric layer, and an upper electrode. The lower electrode includes a first conductive layer, a chemical barrier layer on the first conductive layer, and a second conductive layer on the chemical barrier layer. The chemical barrier layer is between the first and second conductive layers and is a different material than the first and second conductive layers. The dielectric layer is on the lower electrode. The upper electrode is on the dielectric layer opposite to the lower electrode.

In some further embodiments, the first and second conductive layers may each include titanium nitride (TiN), tantalum nitride (TaN), tungsten nitride (WN), ruthenium (Ru), platinum (Pt), ruthenium oxide ($RuO_2$), and/or platinum oxide ($PtO_2$). The first and second conductive layers may have the same thickness. The chemical barrier layer may include polysilicon (poly-Si), polysilicon germanium (poly-SiGe), titanium (Ti), hafnium oxide ($HfO_2$), hafnium oxynitride (HfON), titanium oxide ($TiO_2$), and/or titanium oxynitride (TiON). The chemical barrier layer may be thinner than each of the first and second conductive layers.

In some other embodiments of the present invention, a MIM capacitor includes a semiconductor substrate, an interlayer insulating layer, a conductive plug, a lower electrode, an etch stopper, a dielectric layer, and an upper electrode. The interlayer insulating layer is on the semiconductor substrate. The conductive plug extends from a surface of the semiconductor substrate through the interlayer insulating layer. The lower electrode is on a portion of the interlayer insulating layer and the conductive plug. The etch stopper is on a portion of the interlayer insulating layer adjacent to opposite sides of the lower electrode. The dielectric layer is on the lower electrode and the etch stopper. The upper electrode is on the dielectric layer opposite to the lower electrode. The lower electrode includes a first conductive layer, a chemical barrier layer on the first conductive layer, and a second conductive layer on the chemical barrier layer. The chemical barrier layer is between the first and second conductive layers. The chemical barrier layer is a different material than the first and second conductive layers. The chemical barrier layer is thinner than each of the first and second conductive layers.

Some other embodiments of the present invention provide a method of fabricating a metal-insulator-metal (MIM)

capacitor. A first conductive layer is formed on a semiconductor substrate. A chemical barrier layer is formed on the first conductive layer. A second conductive layer is formed on the chemical barrier layer. The chemical barrier layer includes a different material than the first and second conductive layers. The first conductive layer, the chemical barrier layer, and the second conductive layer form a lower electrode. A dielectric layer is formed on the lower electrode. An upper electrode is formed on the dielectric layer.

Some other embodiments of the present invention provide another method of fabricating a metal-insulator-metal (MIM) capacitor. An interlayer insulating layer is formed on a semiconductor substrate. A conductive plug that extends from a surface of the semiconductor substrate through the interlayer insulating layer is formed. An etch stopper is formed on the interlayer insulating layer. A mold oxide layer is formed on the etch stopper. The mold oxide layer and the etch stopper are partially etched to expose the conductive plug and define a lower electrode region. A first conductive layer is formed on the mold oxide and the conductive plug in the lower electrode region. A chemical barrier layer is formed on the first conductive layer. A second conductive layer is formed on the chemical barrier layer. The chemical barrier layer includes a different material than the first and second conductive layers. The first conductive layer, the chemical barrier layer, and the second conductive layer are planarized to expose an upper surface of the mold oxide layer. The planarized first conductive layer, chemical barrier layer, and second conductive layer form a lower electrode. The mold oxide layer is removed to expose the lower electrode and the etch stopper. A dielectric layer is formed on the lower electrode and the etch stopper. An upper electrode is formed on the dielectric layer.

DETAILED DESCRIPTION OF EMBODIMENTS OF THE INVENTION

Figure 1A:
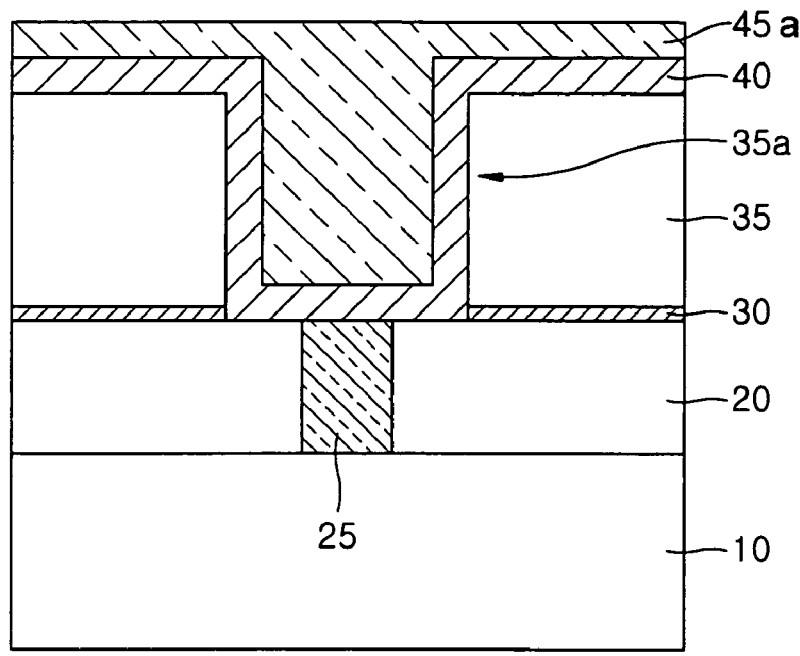
FIGS. 1A through 1C are cross sectional views illustrating a method of fabricating a conventional metal-insulator-metal (MIM) capacitor.
Figure 1B:
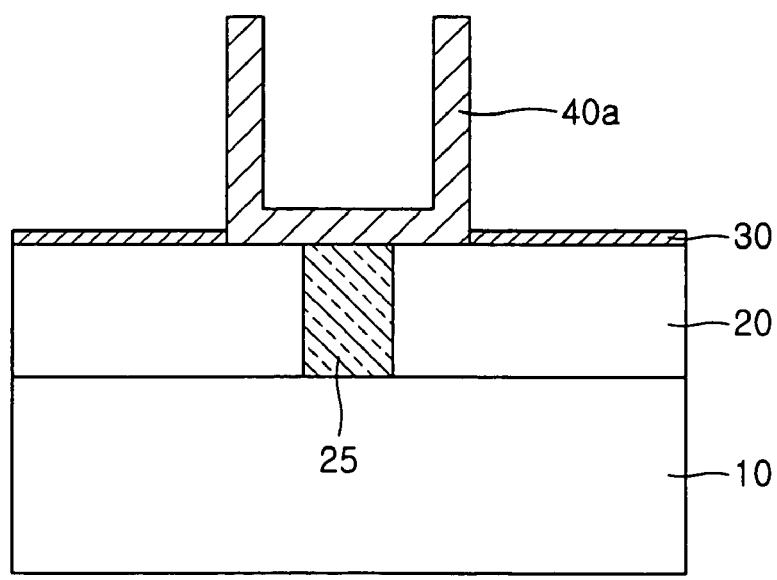
Figure 1C:
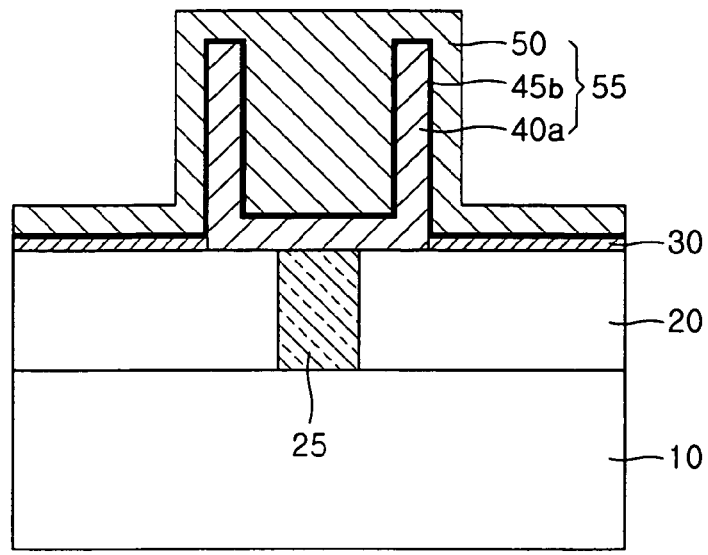

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the drawings.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
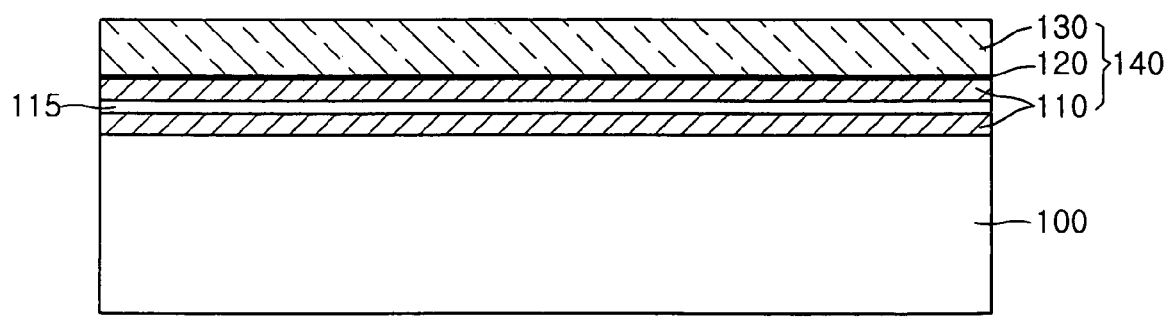
FIG. 2 is a cross sectional view illustrating an MIM capacitor according to an embodiment of the present invention.

FIG. 2 is a sectional view illustrating an MIM capacitor according to an embodiment of the present invention.

Referring to FIG. 2, a lower electrode 110 is formed on a semiconductor substrate 100. The lower electrode 110 can include first and second conductive layers with a chemical barrier layer 115 therebetween. The chemical barrier layer 115 includes a different material than the first and second conductive layers of the lower electrode 110. The chemical barrier layer is configured to prevent or inhibit penetration of an etch chemical there through. Because the chemical barrier layer 115 is between the first and second conductive layers of the lower electrode 110, it may prevent or reduce penetration of an etch chemical used during formation of the capacitor through both of the first and second conductive layers and removal of the material below those layers.

The first and second conductive layers of the lower electrode 110 may each be formed from a metal; a metal nitride such as, for example, titanium nitride (TiN), tantalum nitride (TaN), and/or tungsten nitride (WN); a noble material such as ruthenium (Ru) and/or platinum (Pt); a metal oxide such as ruthenium oxide ($RuO_2$); and/or a mixture thereof. The chemical barrier layer 115 may include a conductive material such as polysilicon (poly-Si), polysilicon germanium (poly-SiGe), and/or titanium (Ti), and/or an insulating material such as hafnium oxide ($HfO_2$), hafnium oxynitride (HfON), titanium oxide ($TiO_2$), and/or titanium oxynitride (TiON). When the chemical barrier layer 115 is an insulating material, the chemical barrier layer 115 is preferably formed as a thin film so as not to generate undesirable dielectric characteristics between the first and second conductive layers of the lower electrode 110.

A dielectric layer 120 is formed on the lower electrode 110 including the chemical barrier layer 115. The dielectric layer 120 may be formed of a high-k dielectric material having a dielectric constant of 20 or higher, for example, a hafnium oxide ($HfO_2$) layer, a zirconium oxide ($ZrO_2$) layer, a lanthanum oxide ($La_2O_5$) layer, and/or a tantalum oxide ($Ta_2O_5$) layer. An upper electrode 130 is formed on the dielectric layer 120 to form a MIM capacitor 140. The upper electrode 130 may include the same material as the first and second conductive layers of the lower electrode 110.

FIGS. 3A through 3F are cross sectional views illustrating methods of fabricating a MIM capacitor according to another embodiment of the present invention.

Figure 3A:
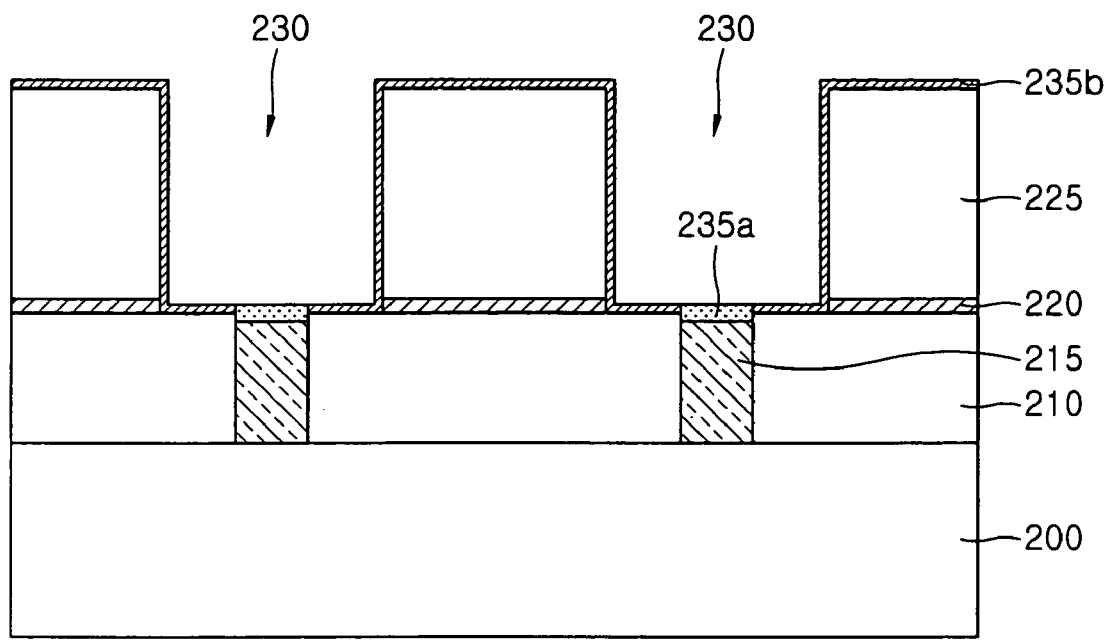
FIGS. 3A through 3F are cross sectional views illustrating methods of fabricating a MIM capacitor according to another embodiment of the present invention.

Referring to FIG. 3A, an interlayer insulating layer 210 is formed on a semiconductor substrate 200. A conductive element (not shown), for example, an MOS transistor, a conductive pad, a bit line, or the like, may be formed between the semiconductor substrate 200 and the interlayer insulating layer 210. A conductive plug 215 can be formed that penetrates through the interlayer insulating layer 210 to contact the substrate 100 using a conventional formation process. The conductive plug 215 may be formed from a metal layer such as a doped polysilicon layer or a titanium nitride layer. The conductive plug 215 may be electrically connected to a source (not shown) of the MOS transistor, or a conductive pad (not shown) electrically connected to the source.

An etch stopper 220 and a mold oxide layer 225 are sequentially deposited on the interlayer insulating layer 210 and the conductive plug 215. The etch stopper 220 may be formed from a material having an etch selectivity with respect to the interlayer insulating layer 210 and the mold oxide layer 225, and may include, for example, silicon nitride. The mold oxide layer 225 is an oxide layer that is used to define a height of the capacitor, and may be formed to have a thickness equal to a desired height of, for example, a lower electrode of the capacitor. The mold oxide layer 225 and the etch stopper 220 are partially etched to expose a portion of the conductive plug 215 and define a lower electrode region 230.

When the conductive plug 215 is formed from doped polysilicon and a lower electrode (not shown) is to be later formed from a metal, formation of an ohmic contact layer may be desirable between the conductive plug 215 and the lower electrode. In order to form the ohmic contact layer, a transition metal layer such as titanium, tantalum, tungsten, or the like is deposited on the surfaces of the lower electrode region 230 and the mold oxide layer 225. In one embodiment of the present invention, the transition metal layer includes titanium and may be formed with a thickness of about 80° (angstroms) to about 90° (angstroms) at a temperature of about 600° C. (Centrigrade) to about 650° C. using a CVD method. Then, an annealing process is performed on the transition metal layer to form the ohmic contact layer as a metal silicide layer 235a on a top surface of the polysilicon conductive plug 215. The annealing process to form the silicide layer 235a may be performed in an atmosphere of nitrogen.

Concurrently with the formation of the silicide layer 235a on the conductive plug 215, the transition metal layer on the surfaces of the interlayer insulating layer 210 and the mold oxide layer 225 can be phase-changed into a metal nitride layer 235b. Alternatively, when the annealing process is performed in an atmosphere other than nitrogen, the transition metal layer that remains after the annealing process may be removed or may be additionally treated with a nitridation process. Further, the transition metal layer can be deposited at a high temperature of 600 through 800° C., and concurrently with the deposition, a transition metal silicide layer 235a can be formed on a surface of the polysilicon conductive plug 215. This method may not require an additional annealing process, which simplifies the fabrication process. When the conductive plug 215 is a metal such as titanium nitride, formation of an ohmic contact layer may not be needed.

Figure 3B:
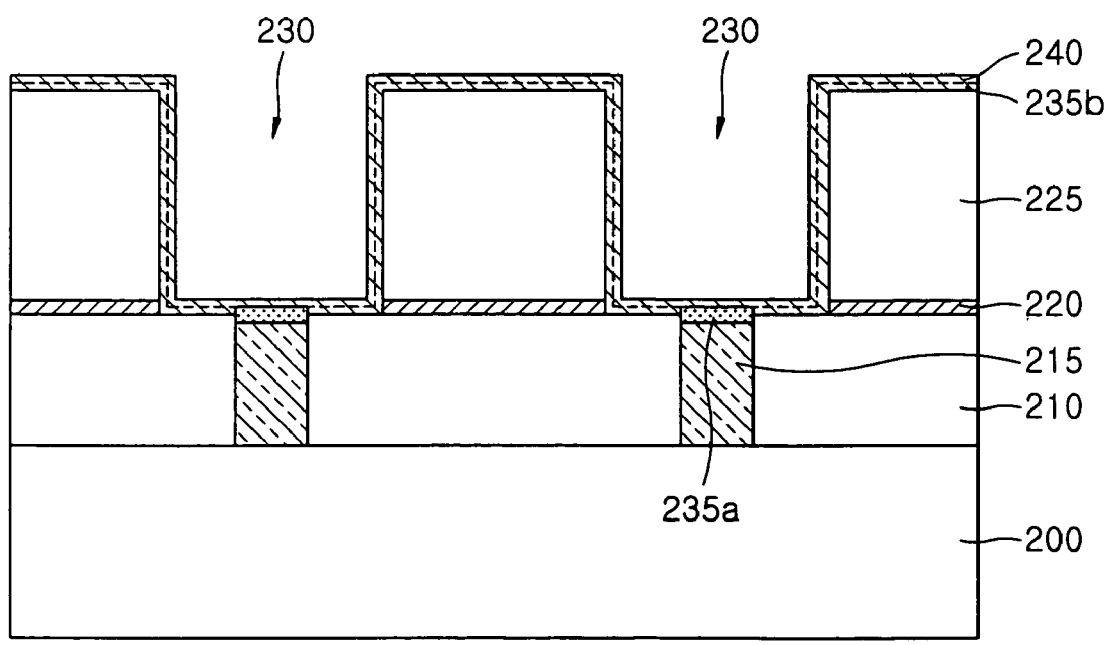

Referring to FIG. 3B, a first conductive layer 240 for a lower electrode is formed on the lower electrode region 230 and the mold oxide layer 225. The first conductive layer 240 can be formed to have a thickness of about ½ a desired thickness of the conductive layers of the lower electrode, for example, about 10 (angstroms) to about 200 (angstroms). The first conductive layer 240 may be formed of a metal nitride layer such as a titanium nitride (TiN) layer, a tantalum nitride (TaN) layer, and/or a tungsten nitride (WN) layer, and/or a noble layer such as a ruthenium (Ru) layer and/or a platinum (Pt) layer, a metal oxide layer such as a ruthenium oxide layer ($RuO_2$) and a platinum oxide layer ($PtO_2$), and/or a mixture thereof. In some embodiments of the present invention, the first conductive layer 240 is formed from a titanium nitride layer. When the metal nitride layer 235b remains on the surfaces of the interlayer insulating layer 210 and the mold oxide layer 225, the first conductive layer 240 may preferably include the same material as the metal nitride layer 235b. The first conductive layer 240 may be formed using a chemical vapor deposition (CVD) method, an atomic layer deposition (ALD) method, or a sequential flow deposition (SFD) method.

Figure 4:
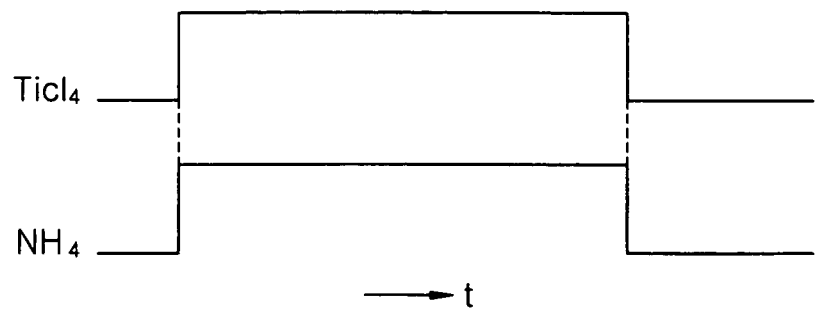
FIG. 4 is a graph of process steps in a method of forming a titanium nitride layer by a CVD process according to an embodiment of the present invention.

For example, when the first conductive layer 240 includes titanium nitride, the first conductive layer 240 may be formed through a chemical vapor deposition (CVD) process that includes simultaneously supplying a titanium source such as, for example, titanium chloride source (TiCl$_4$) and a nitrogen source (NH$_3$) into a chamber for a predetermined time, such as illustrated by the process graph in FIG. 4.

Figure 5:
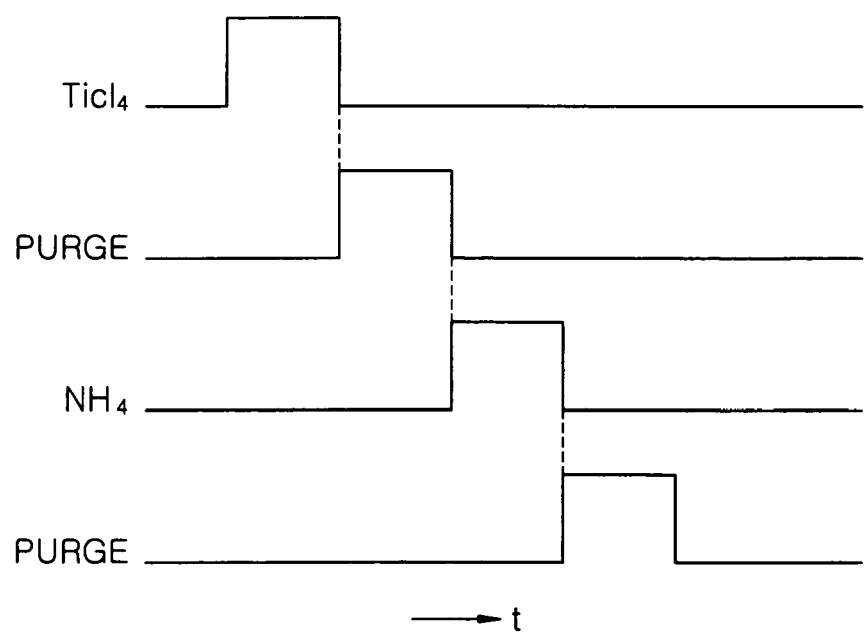
FIG. 5 is a graph of process steps in a method of forming a titanium nitride layer by an ALD process according to an embodiment of the present invention.

A titanium nitride layer for the first conductive layer 240 may alternatively, or additionally, be formed by an atomic layer deposition (ALD) process that includes supplying a titanium chloride source for a predetermined time in a chamber, purging the chamber, supplying a nitrogen source into the chamber, and purging the chamber, such as illustrated by the process graph in FIG. 5.

Figure 6:
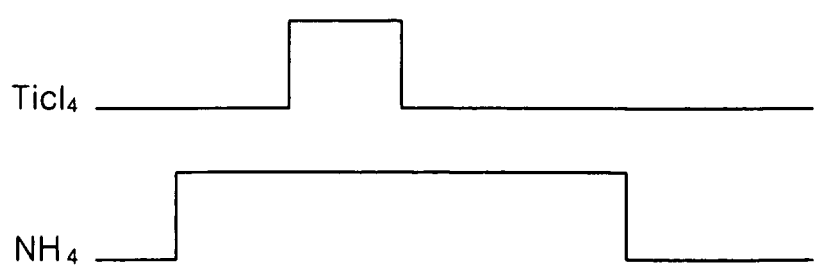
FIG. 6 is a graph of process steps in a method of forming a titanium nitride layer by an SFD process according to an embodiment of the present invention.

A titanium nitride layer for the first conductive layer 240 may alternatively, or additionally, be formed by a sequential flow deposition (SFD) process that includes supplying a nitrogen source for a predetermined time, supplying the nitrogen source and a titanium chloride source concurrently with when the nitrogen source is supplied, and stopping the supply of the titanium chloride source and supplying only the nitrogen source for a predetermined time, such as illustrated by the process graph in FIG. 6. In the SFD process, the nitrogen source, which is supplied for a predetermined time before the titanium chloride source is supplied, can prevent or reduce the chloride group (Cl) of the titanium chloride from penetrating into underneath layers such as, for example, the interlayer insulating layer 210 and the conductive plug 215. Because only the nitrogen source is supplied for a predetermined time after the supply of the titanium chloride source is stopped, the chloride group (Cl) generated during the supply of the titanium chloride source may be easily removed (H+Cl→HCl↑). It can be desirable to prevent the chloride group (Cl) from penetrating into the interlayer insulating layer 210 and the conductive plug 215 or causing stress, defects, or cracks inside the metal nitride layer itself. It can be further desirable to prevent the chloride group (Cl) from degrading the interface characteristics between the metal nitride layer and the etch stopper 220. Because the defined SFD process for forming the first conductive layer 240 supplies a source that is capable of removing the chloride before and after the metal source is formed, such problems caused by the chloride may be reduced.

Figure 3C:
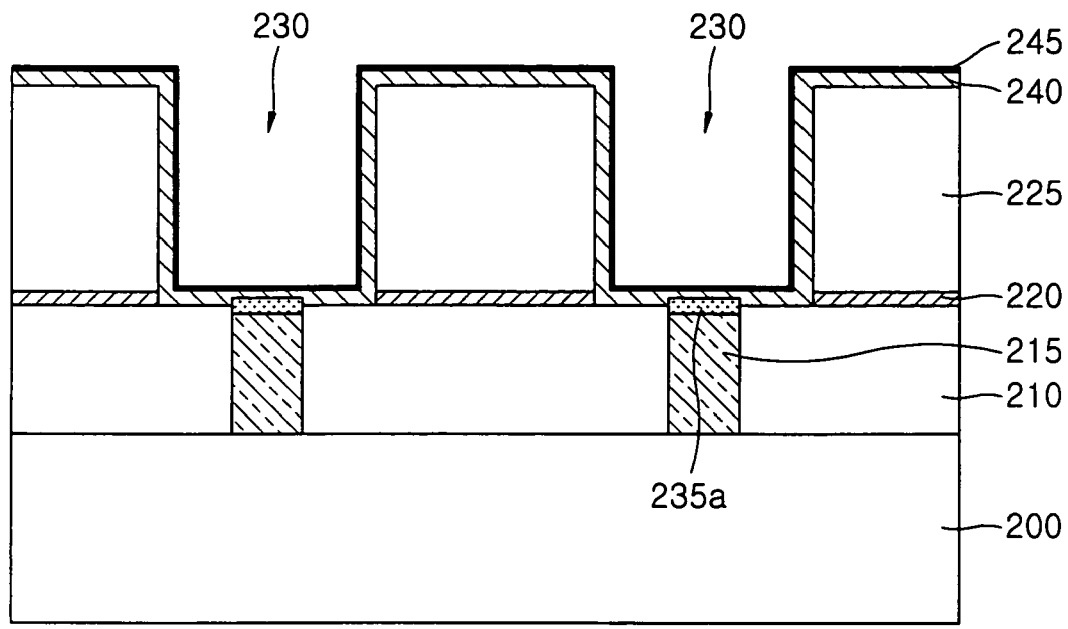

Referring to FIG. 3C, a chemical barrier layer 245 is deposited on a surface of the first conductive layer 240. The chemical barrier layer 245 is formed of a different material than the first conductive layer 240. The chemical barrier layer 245 may be formed from a conductive layer such as a polysilicon (poly-Si) layer, a polysilicon germanium (poly-SiGe) layer, and/or a titanium (Ti) layer, and/or an insulating layer such as a hafnium oxide (HfO$_2$) layer, a hafnium oxynitride (HfON) layer, a titanium oxide (TiO$_2$) layer, and/or a titanium oxynitride (TiON) layer. When the chemical barrier layer 245 is formed of a conductive layer such as a polysilicon germanium layer and/or a titanium layer, the chemical barrier layer 245 may be formed using a CVD process. When the chemical barrier layer 245 is formed of a titanium layer and the first conductive layer 240 is formed of a titanium nitride layer, the first conductive layer 240 and the chemical barrier layer 245 may be formed in-situ. When the chemical barrier layer 245 is formed of an insulating layer such as a hafnium oxide layer, a hafnium oxynitride layer, a titanium oxide layer, and/or a titanium oxynitride layer, the chemical barrier layer 245 may be formed using an ALD process.

When the chemical barrier layer 245 uses a titanium oxide layer and a titanium oxynitride layer, the chemical barrier layer 245 may be formed by performing a rapid thermal oxidation (RTO) process on the first conductive layer 240. The chemical barrier layer 245 is preferably formed as a thin film with a thickness of, for example, about 1 Å (angstroms) to about 50 Å in consideration of the resistance increase of an underneath electrode. When the chemical barrier layer 245 is an insulating layer, the chemical barrier layer 245 is preferably formed as a thin film so that an undesirable dielectric characteristic is not generated between the second conductive layer and the first conductive layer when voltage is applied between the first and second conductive layers, and so that charges can tunnel between the first and second conductive layers.

Figure 3D:
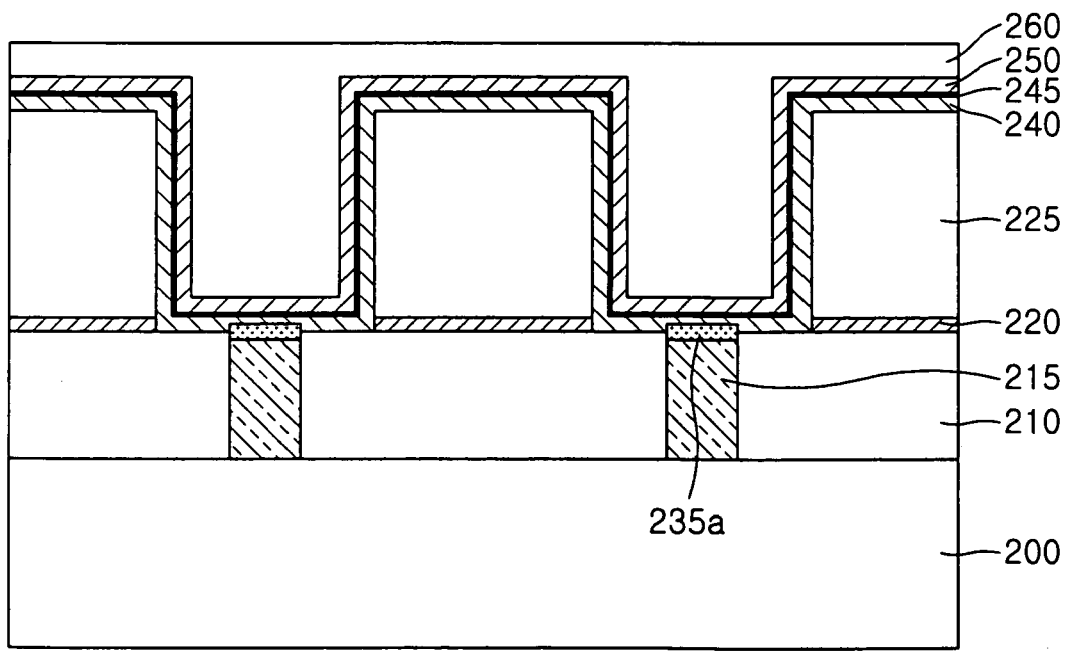

Referring to FIG. 3D, a second conductive layer 250 for a lower electrode is formed on the chemical barrier layer 245. Like the first conductive layer 240, the second conductive layer 250 may be formed from a metal nitride layer such as a titanium nitride (TiN) layer, a tantalum nitride (TaN) layer, and/or a tungsten nitride (WN) layer, and/or a noble layer such as a ruthenium (Ru) layer and/or a platinum (Pt) layer, and/or a metal oxide layer such as a ruthenium oxide layer (RuO$_2$) and/or a platinum oxide layer (PtO$_2$). The second conductive layer 250 may be formed using a CVD process, an ALD process, and/or a SFD process. Further, the second conductive layer 250 may be formed with a thickness of the first conductive layer 240, or may have a thickness defined based on subtracting the thickness of the first conductive layer 240 from a desired total thickness of the lower electrode, for example, about 10 Å to about 200 Å.

A sacrificial layer 260 is deposited on the second conductive layer 250. The sacrificial layer 260 may be formed from, for example, a silicon oxide layer. The sacrificial layer 260 is formed with a thickness that is sufficient to fill the lower electrode region 230.

Figure 3E:
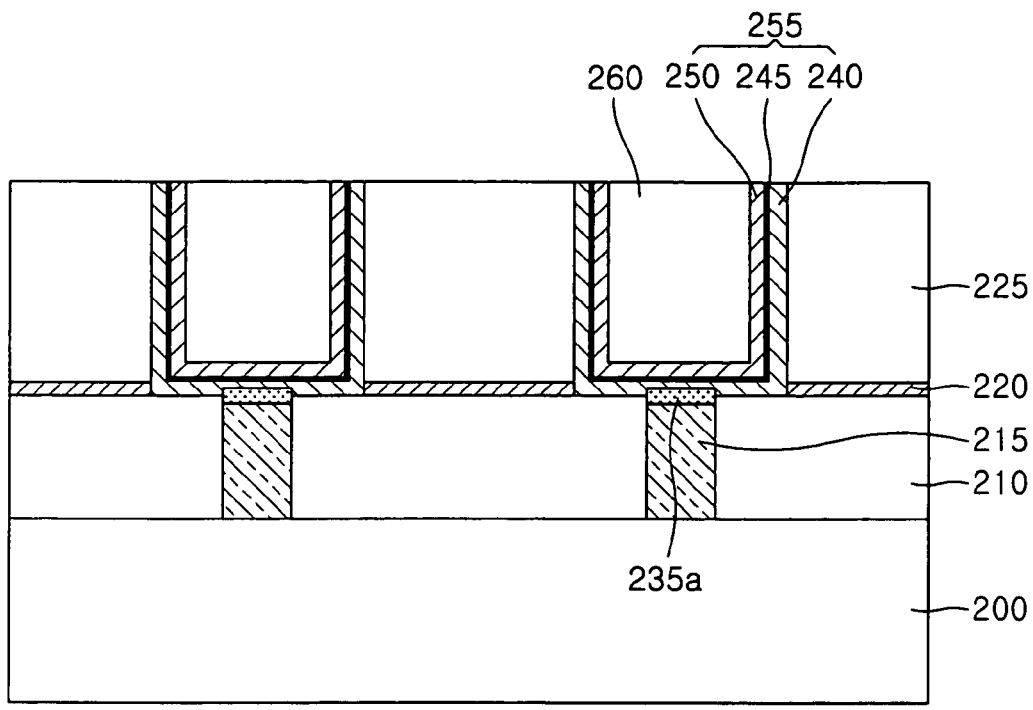

Referring to FIG. 3E, the sacrificial layer 260, the second conductive layer 250, the chemical barrier layer 245, and the first conductive layer 240 are planarized until the surface of the mold oxide layer 225 is exposed, thereby forming a lower electrode 225. The planarization process may include a chemical mechanical polishing process and/or an etch-back process.

Figure 3F:
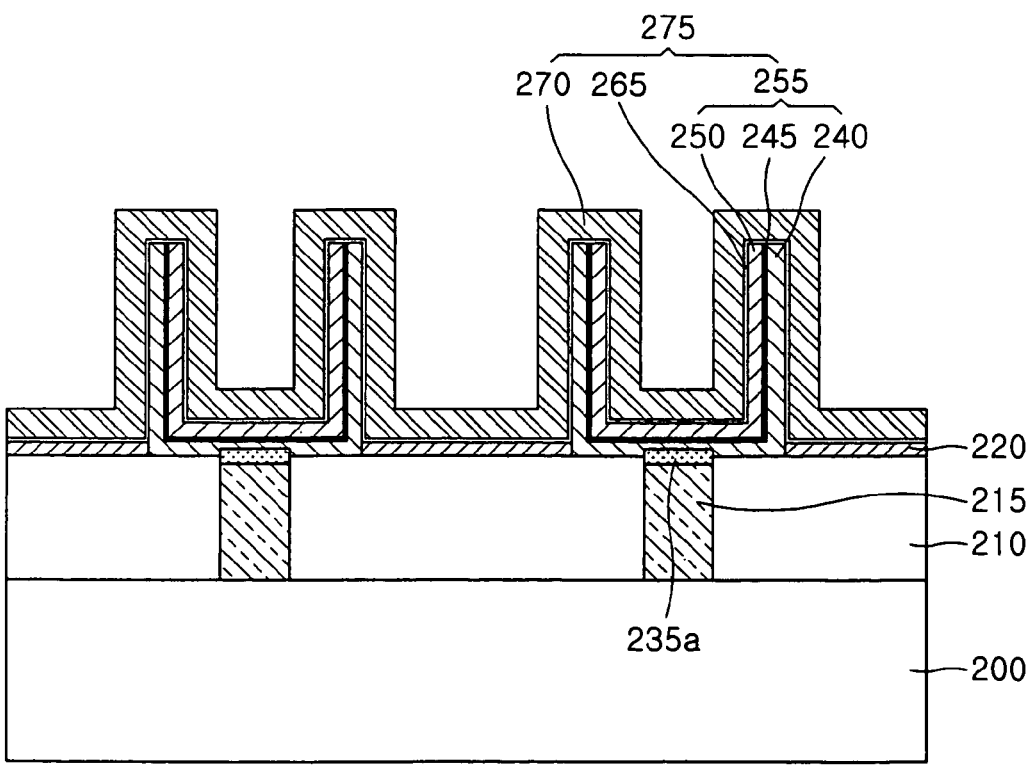

Then, referring to FIG. 3F, the remained sacrificial layer 260 and the mold oxide layer 225 are removed using a wet etch solution that may include, for example, an LAL solution and/or a HF solution. During the removal of the sacrificial layer 260 and the mold oxide layer 225, because the chemical barrier layer 245 is between the first and second conductive layers 240, 250 of the lower electrode 255, the wet etch solution can be prevented or inhibited from penetrating completely through the lower electrode 255. The chemical barrier layer 245 may also alleviate stress at the interface between the lower electrode 255 and the etch stopper 220. The chemical barrier layer 245 may prevent the wet etch solution from flowing through into the interface between the lower electrode 255 and the etch stopper 220. Consequently, the chemical barrier layer 245 may prevent or inhibit removal of material of the interlayer insulating layer 210 and the conductive plug 215 below the lower electrode 255 and the etch stopper 220 by the wet etch solution.

A dielectric layer 265 is then formed on the surface of the lower electrode 255 and on the etch stopper 220. The dielectric layer 265 may include a high-k dielectric having a dielectric constant of 20 or higher, such as, for example, a hafnium oxide (HfO$_2$) layer, a zirconium oxide (ZrO$_2$) layer, a lanthanum oxide (La$_2$O$_5$) layer, and/or a tantalum oxide (Ta$_2$O$_5$)

layer. In order to improve the electrical characteristic of the dielectric layer 265, an annealing process can be additionally performed on the dielectric layer 265. The annealing process of the dielectric layer 265 may be performed in, for example, a plasma state.

Then, an upper electrode 270 is formed on the dielectric layer 265 to form a MIM capacitor 275. The upper electrode 270 may be formed from the same type of material as that of the first conductive layer 240 and/or the second conductive layer 250 of the lower electrode 255, and may be formed in the similar process to that used to form the first and/or second conductive layers 240, 250 of the lower electrode 255.

A capping layer (not shown) may be additionally deposited in order to improve the adhesive characteristic of the capacitor 275 and an inter-metal insulating layer (not shown) to be formed later.

Figure 7:
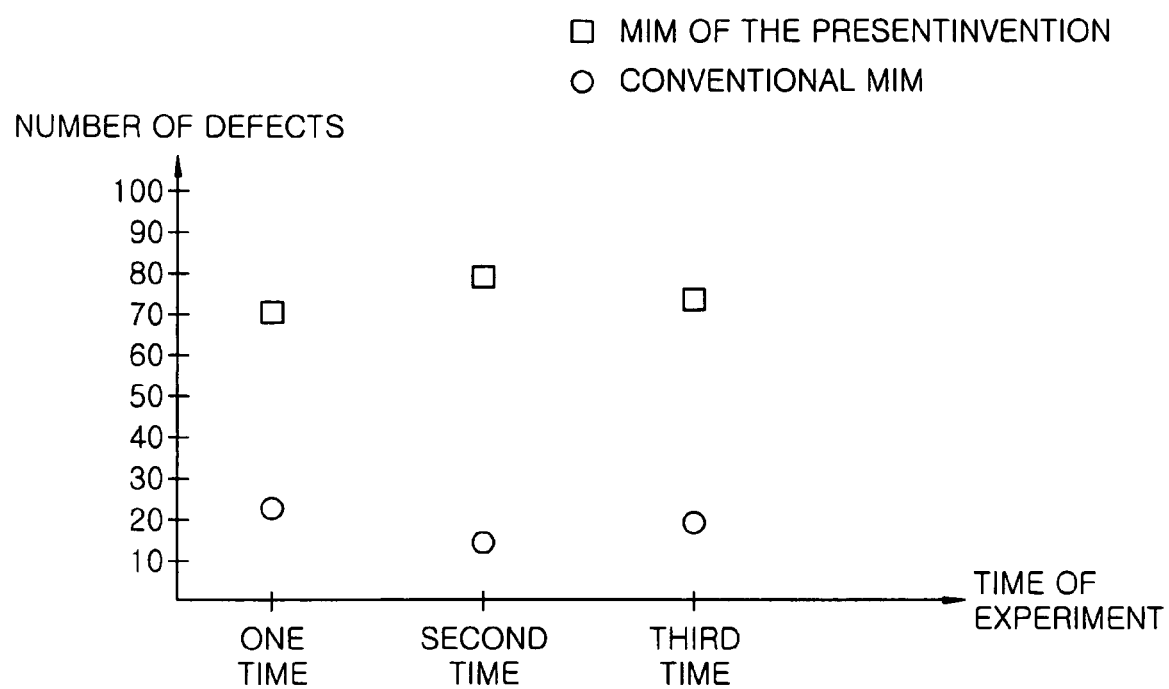
FIG. 7 is an exemplary graph of defects that may occur in a MIM capacitor fabricated according to an embodiment of the present invention compared to defects in a conventionally fabricated MIM capacitor.

FIG. 7 is an exemplary graph of defects that may occur as a result of fabrication of a MIM capacitor according to an embodiment of the present invention compared to defects in a conventionally fabricated MIM capacitor. The lower electrode of the MIM capacitor of the present invention includes a first and second titanium nitride (TiN) layers with a thickness of 150 Å and a chemical barrier layer ($TiO_2$) with a thickness of 50 Å interposed between the first and second titanium nitride layers. The lower electrode of the conventional MIM capacitor includes a single titanium nitride (TiN) layer with a thickness of 300 Å.

As shown in FIG. 7, less defects may occur in a MIM capacitor that includes a lower electrode with a chemical barrier layer between two conductive layers.

As described above, the chemical barrier layer may prevent a wet etch solution from penetrating into the inside of the lower electrode during a wet etch process to form the cylindrical-shaped lower electrode. The chemical barrier layer may also alleviate interface stresses between the lower electrode and the etch stopper that is adjacent to opposite sides of the lower electrode, and to block the wet etch solution from penetrating the interface between the lower electrode and the etch stopper.

The chemical barrier layer may also prevent the wet etch solution from reaching the layers below the lower electrode and the etch stopper and may thereby prevent loss of the insulating layer/or the conductive plug below the lower electrode and the etch stopper. As a result, the electrical characteristics of the capacitor may be improved and the number of defects that are generated during fabrication of the device elements may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a metal-insulator-metal (MIM) capacitor, the method comprising:
    forming a first conductive layer on a semiconductor substrate and with major portions extending upward away from the semiconductor substrate;
    forming a chemical barrier layer on the first conductive layer including on the major portions extending away from the semiconductor substrate;
    forming a second conductive layer on the chemical barrier layer and with major portions extending upward away from the semiconductor substrate, wherein the chemical barrier layer is between the first and second conductive layers, and the chemical barrier layer comprises a different material than the first and second conductive layers, and wherein the first conductive layer, the chemical barrier layer, and the second conductive layer provide a lower electrode;
    forming a dielectric layer on the lower electrode; and
    forming an upper electrode on the dielectric layer,
    wherein forming a first conductive layer and forming a second conductive layer each comprise depositing a layer of titanium nitride (TiN), tantalum nitride (TaN), tungsten nitride (WN), ruthenium (Ru), platinum (Pt), ruthenium oxide ($RuO_2$), and/or platinum oxide ($PtO_2$).

2. The method according to claim 1, wherein forming a first conductive layer and forming a second conductive layer each comprise a chemical vapor deposition (CVD) process, an atomic layer deposition (ALD) process, and/or a sequential flow deposition (SFD) process.

3. The method according to claim 1, wherein the chemical barrier layer is formed from polysilicon (poly-Si), polysilicon germanium (poly-SiGe), titanium (Ti), hafnium oxide ($HfO_2$), hafnium oxynitride (HfON), titanium oxide ($TiO_2$), and/or titanium oxynitride (TiON).

4. The method according to claim 3, wherein forming a chemical barrier layer comprises a chemical vapor deposition (CVD) process, an atomic layer deposition (ALD) process, and/or a rapid thermal oxidation process.

5. A method of fabricating a metal-insulator-metal (MIM) capacitor the method comprising:
    forming an interlayer insulating layer on a semiconductor substrate;
    forming a conductive plug that extends from a surface of the semiconductor substrate through the interlayer insulating layer;
    forming an etch stopper on the interlayer insulating layer;
    forming a mold oxide layer on the etch stopper;
    partially etching the mold oxide layer and the etch stopper to form an opening that exposes the conductive plug and define a lower electrode region;
    forming a first conductive layer on sidewalls of the opening of the mold oxide and the conductive plug in the lower electrode region;
    forming a chemical barrier layer on the first conductive layer;
    forming a second conductive layer on the chemical barrier layer, wherein the chemical barrier layer is between the first and second conductive layers, and the chemical barrier layer comprises a different material than the first and second conductive layers;
    planarizing the first conductive layer, the chemical barrier layer, and the second conductive layer to expose an upper surface of the mold oxide layer, wherein the planarized first conductive layer, chemical barrier layer, and second conductive layer form a lower electrode;
    removing the mold oxide layer to expose the lower electrode and the etch stopper;
    forming a dielectric layer on the lower electrode and the etch stopper; and
    forming an upper electrode on the dielectric layer,
    wherein forming a first conductive layer and forming a second conductive layer each comprise depositing a layer of titanium nitride (TiN), tantalum nitride (TaN), tungsten nitride (WN), ruthenium (Ru), platinum (Pt), ruthenium oxide ($RuO_2$), and/or platinum oxide ($PtO_2$).

6. The method according to claim 5, wherein:
    forming an interlayer insulating layer comprises depositing an insulating layer on the semiconductor substrate; and
    forming a conductive plug comprises:

etching a portion of the insulating layer to expose a portion of the semiconductor substrate and form a contact hole thereto; and filling the contact hole with a metal to form the conductive plug.

7. The method according to claim 5, wherein:

forming an interlayer insulating layer comprises depositing an insulating layer on the semiconductor substrate; and forming a conductive plug comprises:

etching a portion of the insulating layer to expose a portion of the semiconductor substrate and form a contact hole thereto; and filling the contact hole with doped polysilicon to form the conductive plug.

8. The method according to claim 7, after partially etching the mold oxide layer and the etch stopper to expose the conductive plug and define a lower electrode region and before forming a first conductive layer on the mold oxide and the conductive plug in the lower electrode region, the method further comprising forming an ohmic contact layer on an exposed surface of the conductive plug.

9. The method according to claim 8, further comprising:

forming a transition metal layer on the exposed surface of the conductive plug and the mold oxide layer; and annealing the transition metal layer to form a transition metal silicide layer on a surface of the conductive plug.

10. The method according to claim 9, after annealing the transition metal layer to form a transition metal silicide layer on a surface of the conductive plug, the method further comprising carrying out a nitridation process on the transition metal layer.

11. The method according to claim 9, after annealing the transition metal layer to form a transition metal silicide layer on a surface of the conductive plug, the method further comprising removing the transition metal layer.

12. The method according to claim 5, wherein forming a first conductive layer and forming a second conductive layer each comprise a chemical vapor deposition (CVD) process, an atomic layer deposition (ALD) process, and/or a sequential flow deposition (SFD) process.

13. The method according to claim 5, wherein the chemical barrier layer is formed from polysilicon (poly-Si), polysilicon germanium (poly-SiGe), titanium (Ti), hafnium oxide ($HfO_2$), hafnium oxynitride (HfON), titanium oxide ($TiO_2$), and/or titanium oxynitride (TiON).

14. The method according to claim 13, wherein forming a chemical barrier layer comprises a chemical vapor deposition (CVD) process, an atomic layer deposition (ALD) process, and/or a rapid thermal oxidation process.

15. The method according to claim 5, after forming a second conductive layer on the chemical barrier layer and before planarizing the first conductive layer, the chemical barrier layer, and the second conductive layer to expose an upper surface of the mold oxide layer, the method further comprising forming a sacrificial layer on the second conductive layer.

16. The method according to claim 15, wherein planarizing the first conductive layer, the chemical barrier layer, and the second conductive layer to expose an upper surface of the mold oxide layer comprises chemical mechanical polishing and/or an etching the sacrificial layer, the first conductive layer, the chemical barrier layer, and the second conductive layer to expose an upper surface of the mold oxide layer.

17. The method according to claim 5, wherein the mold oxide layer is removed using an LAL solution of deionized water, $NH_4F$ and HF and/or a HF solution.

18. The method according to claim 5, wherein the dielectric layer is formed from hafnium oxide, zirconium oxide, lanthanum oxide, and/or tantalum oxide.

19. The method according to claim 5, wherein the upper electrode is formed from the same material as the first conductive layer and/or the second conductive layer.

* * * * *